(12) United States Patent
Lee et al.

(10) Patent No.: US 7,902,889 B2
(45) Date of Patent: Mar. 8, 2011

(54) DELAY LOCKED LOOP

(75) Inventors: Seong-Jun Lee, Kyoungki-do (KR); Min-Young You, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 33 days.

(21) Appl. No.: 11/819,811

(22) Filed: Jun. 29, 2007

(65) Prior Publication Data
US 2008/0100353 A1 May 1, 2008

(30) Foreign Application Priority Data
Oct. 31, 2006 (KR) .................. 10-2006-0106781

(51) Int. Cl.
*H03L 7/06* (2006.01)
(52) U.S. Cl. ....................................... 327/158
(58) Field of Classification Search .......... 327/156, 327/157, 158, 159, 299; 375/375, 376, 373; 331/1 R
See application file for complete search history.

(56) References Cited

U.S. PATENT DOCUMENTS

| | | | | |
|---|---|---|---|---|
| 6,166,572 A * | 12/2000 | Yamaoka | ............ | 327/149 |
| 6,242,954 B1 * | 6/2001 | Taniguchi et al. | ............ | 327/149 |
| 6,621,315 B2 * | 9/2003 | Heo et al. | ............ | 327/158 |
| 6,768,690 B2 * | 7/2004 | Kwon et al. | ............ | 365/194 |
| 6,791,420 B2 * | 9/2004 | Unterricker | ............ | 331/1 A |
| 6,813,197 B2 | 11/2004 | Park | | |
| 6,989,700 B2 | 1/2006 | Kim | | |
| 7,103,133 B2 | 9/2006 | Jung | | |
| 7,106,114 B2 * | 9/2006 | Taniguchi | ............ | 327/158 |
| 7,154,311 B2 | 12/2006 | Lim | | |
| 7,170,313 B2 | 1/2007 | Shin | | |
| 2002/0097074 A1 * | 7/2002 | Kim et al. | ............ | 327/158 |
| 2003/0123597 A1 * | 7/2003 | Cho | ............ | 375/376 |
| 2005/0116751 A1 * | 6/2005 | Lin et al. | ............ | 327/158 |
| 2007/0069775 A1 * | 3/2007 | Ku et al. | ............ | 327/158 |
| 2008/0116950 A1 * | 5/2008 | Baek et al. | ............ | 327/158 |
| 2008/0157836 A1 * | 7/2008 | Cho | ............ | 327/158 |

FOREIGN PATENT DOCUMENTS
JP 2005-251370 9/2005
(Continued)

OTHER PUBLICATIONS

Korean Office Action, with English Translation, issued in corresponding Korean Patent Application No. 9-5-2007-061185565, mailed on Nov. 19, 2007.

(Continued)

*Primary Examiner* — Lincoln Donovan
*Assistant Examiner* — Sibin Chen
(74) *Attorney, Agent, or Firm* — IP & T Group LLP

(57) ABSTRACT

A delay locked loop includes a buffer for outputting an internal clock by buffering an external clock, a delay block for delaying the internal clock in response to one of control signals or a selection signal, thereby outputting a delayed clock, a control signal generation block for generating at least one control signal according to a phase difference between the internal clock and a feedback clock generated by delaying the delayed clock by a delay time taken for the internal clock to be output, a selection block for outputting at least one selection signal in response to a signal instructing an off mode of the delay locked loop, thereby controlling a delay time in the delay block, and an output driver for driving the delayed clock.

6 Claims, 3 Drawing Sheets

FOREIGN PATENT DOCUMENTS

| | | |
|---|---|---|
| KR | 10-2001-0064123 | 7/2001 |
| KR | 102003000334 A | 1/2003 |
| KR | 10-2003-0018627 | 3/2003 |
| KR | 102004009381 A | 11/2004 |
| KR | 10-2005-0067544 A1 | 7/2005 |
| KR | 10-2006-0036662 | 5/2006 |

OTHER PUBLICATIONS

Korean Office Action, issued in Korean Patent Application No. 10-2006-0106781, dated on Feb. 1, 2008.

* cited by examiner

US 7,902,889 B2

DELAY LOCKED LOOP

CROSS-REFERENCES TO RELATED APPLICATIONS

The present invention claims priority of Korean patent application number 10-2006-0106781 filed on Oct. 31, 2006, which is incorporated by reference in its entirety.

BACKGROUND OF THE INVENTION

The present invention relates to a semiconductor architecture technology, more particularly, to a delay locked loop.

Synchronous semiconductor memory devices such as double data rate synchronous dynamic random access memories (DDR SDRAMs) generate a delay locked loop (DLL) clock that is synchronized with an external clock input from an external device such as a memory controller. Synchronous semiconductor memory devices transmit data to external devices according to a DLL clock. For the clock-based data transmission, synchronous semiconductor memory devices include a clock-synchronization circuit. A phase locked loop (PLL) and a DLL are examples of the clock-synchronization circuit.

A DLL compensates for delay in a clock generated inside a synchronous semiconductor memory device while the clock is transported to a data output terminal, and generates a DLL clock that is synchronized with an external clock. As compared with the PLL, the DLL has low noise and can be configured in small size. For this reason, the DLL is generally used as a synchronization circuit in synchronous semiconductor memory devices.

FIG. 1 illustrates a block diagram of a conventional DLL. As illustrated, the DLL includes a buffer 10, a phase detection block 20, a delay model block 30, a delay control block 40, a delay line (or delay block) 50, and an output driver 60.

Upon receipt of an external clock CLK_EXT, the buffer 10 buffers the external clock CLK_EXT, and generates an internal clock CLK_INN. The internal clock CLK_INN is inputted to the phase detection block 20 and the delay line 50. The phase detection block 20 compares a phase of the internal clock CLK_INN with the phase of a feedback clock CLK_FDB, which is an output signal of the delay model block 30. According to the comparison result, the delay control block 40 outputs a plurality of control signals CTR1, CTR2, . . . , and CTRn, where n is a natural number. The delay line 50 delays the internal clock CLK_INN in response to the control signals CTR1, CTR2, . . . , CTRn. The delay model block 30 models factors that delay a clock inside the synchronous semiconductor memory device, and receives an output clock of the delay line 50 and outputs the feedback clock CLK_FDB.

The output driver 60 drives upon receipt of the output clock of the delay line 50 to output a DLL clock CLK_DLL. Although not illustrated, the DLL clock CLK_DLL is provided to an output buffer so as to be used for synchronization between the external clock CLK_EXT and data to be outputted.

In case of analyzing performance of the synchronous semiconductor memory device, a method of analyzing performance while turning on the DLL (hereinafter referred to as "DLL-ON MODE"), a method of analyzing performance while turning off the DLL (hereinafter referred to as "DLL-OFF MODE"), or other similar methods are used.

Hereinafter, limitations associated with the DLL-ON MODE will be described. For the conventional DLL-OFF MODE, some elements of the DLL operate. That is, the buffer 10 generates the internal clock DLK_INN upon receipt of the external clock CLK_EXT. The delay line 50 delays the internal clock CLK_INN by a given delay value (i.e., initial unit delay) preset by a designer of the DLL. The output driver 60 drives the delayed internal clock, which is then outputted as the DLL clock CLK_DLL. The DLL clock CLK_DLL is inputted to the output buffer. Therefore, the data are outputted in response to the DLL clock CLK_DLL locked regardless of the external clock CLK_EXT.

However, at the operation by the DLL clock CLK_DLL having the locked delay time, the data may not secure a sufficient margin to be outputted, and thus, accurate estimation of an operation state may be difficult. Especially, this limitation becomes severe in the case of a high-frequency clock. Under this condition, if an external power supply voltage changes, the delay time also changes. Due to the variation in delay time caused by the external power supply voltage, an additional data strobe signal is generally used to confirm the data to be outputted in the conventional semiconductor memory device.

SUMMARY OF THE INVENTION

Specific embodiments of the present invention are directed toward providing a delay locked loop (DLL) improved in a DLL clock and a data margin by selecting a delay time of an internal clock using a selection signal generated during a DLL-OFF MODE.

In accordance with one aspect of the present invention, there is provided a delay locked loop, including a buffer for outputting an internal clock by buffering an external clock, a delay block for delaying the internal clock in response to one of control signals or a selection signal, thereby outputting a delayed clock, a control signal generation block for generating at least one control signal according to a phase difference between the internal clock and a feedback clock generated by delaying the delayed clock by a delay time taken for the internal clock to be output, a selection block for outputting at least one selection signal in response to a signal instructing an off mode of the delay locked loop, thereby controlling a delay time in the delay block, and an output driver for driving the delayed clock.

DESCRIPTION OF SPECIFIC EMBODIMENTS

Figure 1:
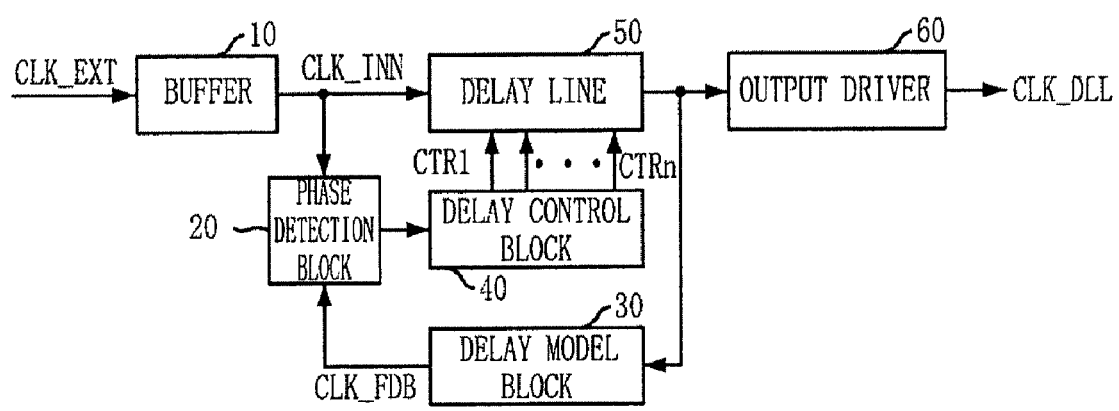
FIG. 1 illustrates a simplified block diagram of a conventional delay locked loop (DLL).
Figure 2:
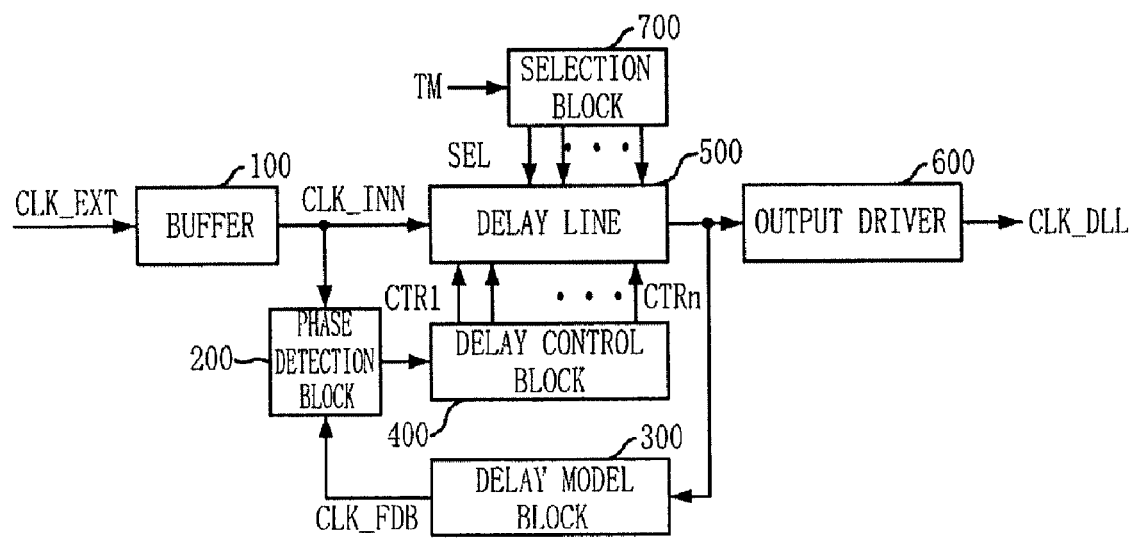
FIG. 2 illustrates a simplified block diagram of a DLL in accordance with a first embodiment of the present invention.

FIG. 2 illustrates a simplified block diagram of a delay locked loop (DLL) in accordance with a first embodiment of the present invention. The DLL includes a buffer 100, a phase detection block 200, a delay model block 300, a delay control block 400, a delay line (or delay block) 500, an output driver 600, and a selection block 700. The buffer 100, the phase detection block 200, the delay model block 300, the delay control block 400, and the output driver 600 have the technical configuration and functions substantially the same as the conventional ones. A difference of the present embodiment on the DLL from the conventional DLL (refer to FIG. 1) is that the selection block 700 is additionally configured therein, and thus, a DLL clock CLK_DLL in which an internal clock CLK_INN is selectively delayed can be generated.

Hereinafter, characteristic operations of the selection block 700 will be described in detail. The selection block 700 outputs at least one selection signal SEL in response to a test signal TM enabled during the execution of a DLL-OFF MODE. The selection signal SEL is inputted to the delay line 500 to select a delay time of the internal clock CLK_INN.

Figure 4:
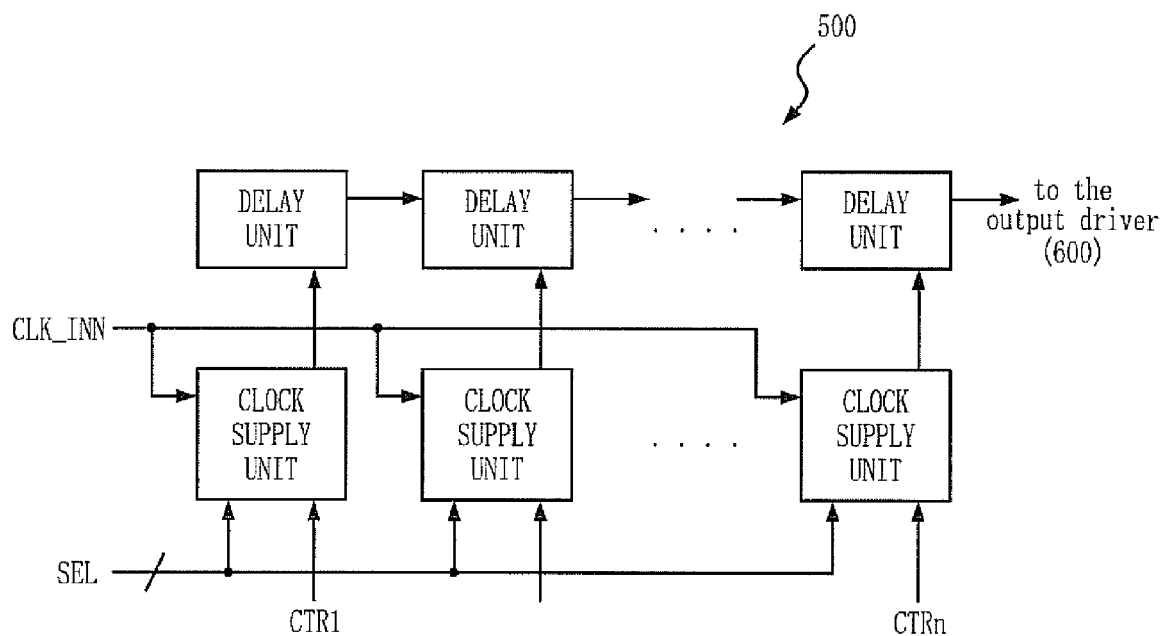
FIG. 4 illustrates a simplified block diagram of a delay line shown in FIGS. 2 and 3.

The delay line 500 includes a plurality of delay units connected in series, and a plurality of clock supply units supplying the internal clock CLK_INN to each of the delay units in response to control signals CTR1, CTR2, . . . , CTRn, where n is a natural number, or the selection signal SEL. The plurality of delay units and the plurality of clock supply units are shown in FIG. 4. In response to the control signals CTR1, CTR2, . . . , CTRn or the selection signal SEL, the delay line 500 determines a delay path that can provide a desired delay time.

In other words, when the DLL is in an 'on' mode, the internal clock CLK_INN is delayed in response to the control signals CTR1, CTR2, . . . , CTRn. In contrast, when the DLL is in an 'off' mode, a delay time of the internal clock CLK_INN is selectively determined in response to the selection signal SEL.

Figure 3:
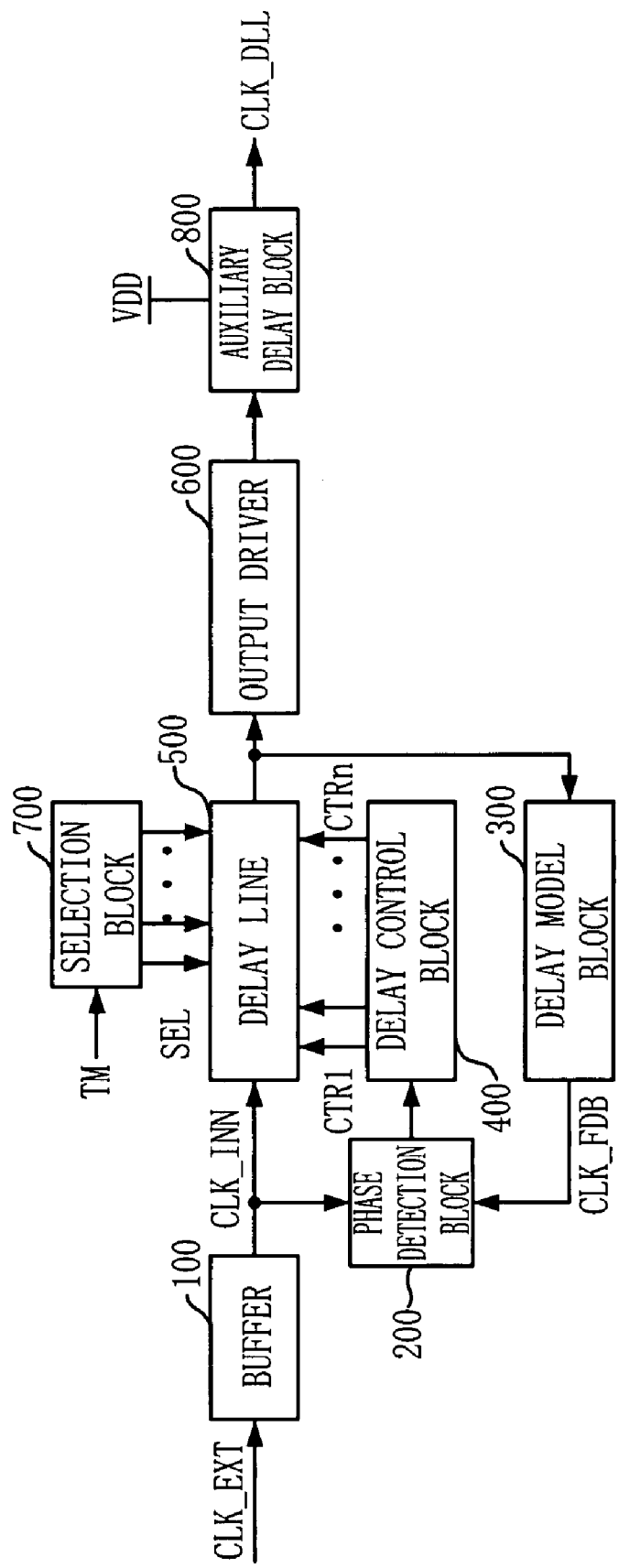
FIG. 3 illustrates a simplified block diagram of a DLL in accordance with a second embodiment of the present invention.

FIG. 3 illustrates a simplified block diagram of a DLL in accordance with a second embodiment of the present invention. Like reference numerals used in the present embodiment represent like elements described in FIG. 2.

The buffer 100, the phase detection block 200, the delay model block 300, the delay control block 400, the output driver 600, and the selection block 700 have the technical configuration and functions substantially the same as the DLL according to the first embodiment of the present invention, and thus, detailed description thereof will be omitted. An auxiliary delay block 800 is additionally configured in the DLL to improve a data margin.

Figure 5:
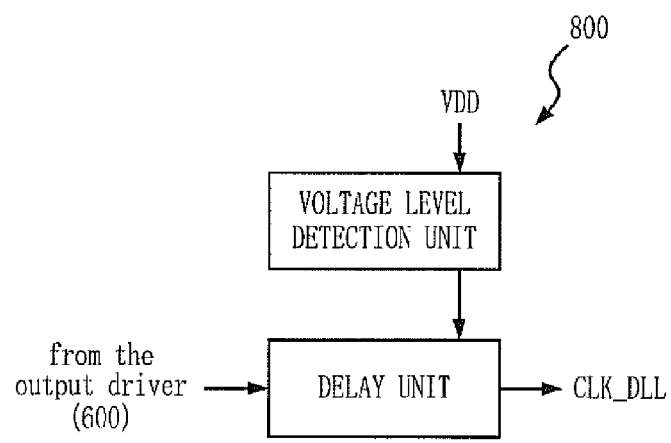
FIG. 5 illustrates a simplified block diagram of an auxiliary delay block shown in FIG. 3.

As shown in FIG. 5, the auxiliary delay block 800 includes a voltage level detection unit detecting an external power supply voltage VDD, and a delay unit delaying an output signal of the output driver 600 according the detection result. The auxiliary delay block 800 delays the output signal of the output driver 600 according to a voltage level of the external power supply voltage VDD.

For instance, when a delay time of the delay line 500 is shortened because of a high voltage level of the external power supply voltage VDD, the auxiliary delay block 800 compensates for a time as much as the shortened time. More specifically, the delay model block 300 needs to be designed considering the auxiliary delay block 800.

In the DLL as described above, the selection block 700 selects a delay time of the internal clock CLK_INN during the DLL-ON MODE, and the DLL clock CLK_DLL generated as above can improve the data margin. Also, the auxiliary delay block 800 can also improve the data margin associated with the external power supply voltage VDD.

According to various embodiments of the present invention, even if the DLL turns off, data can be stably outputted with a sufficient margin in synchronous with the external clock. The margin can be also secured even in a change in the external power supply voltage. Hence, various tests can be carried out while data are outputted normally. Since an output of data is allowed even if the DLL turns off, an amount of current dissipated in the DLL can be reduced.

While the present invention has been described with respect to specific embodiments, it will be apparent to those skilled in the art that various changes and modifications may be made without departing from the spirit and scope of the invention as defined in the following claims. For instance, the specific embodiments exemplify cases associated with the DLL of the synchronous semiconductor memory device. However, those skilled in the art would clearly understand that securing the output margin of the data is generally important in any device that outputs data in synchronous with the clock. Therefore, the spirit and scope of the present invention should be determined based on the sprit and scope of the following claims.

What is claimed is:

1. A delay locked loop comprising:
    a buffer for outputting an internal clock by buffering an external clock;
    a delay block for delaying the internal clock for a delay time determined in response to a plurality of selection signals and a plurality of control signals, thereby outputting a delayed clock;
    a control signal generation block for generating at least one control signal according to a phase difference between the internal clock and a feedback clock generated by delaying the delayed clock by a delay time taken for the internal clock to be outputted;
    a selection block for outputting the plurality of selection signals in response to a signal instructing an off mode of the delay locked loop, wherein the selection signals are configured to select the delay time in the delay block during the off mode and are used to delay the internal clock with the selected delay time in the delay block; and
    an output driver for driving the delayed clock,
    wherein the delay locked loop is turned off during the off mode so that the feedback clock is not used by the delay locked loop in controlling the delayed clock during the off mode.

2. The delay locked loop of claim 1, further comprising an auxiliary delay block for changing a delay of an output signal of the output driver when a voltage level of an external power supply voltage changes from a first voltage level to a second voltage level higher than the first voltage.

3. The delay locked loop of claim 2, wherein the auxiliary delay block comprises:
    a voltage level detection unit for detecting a voltage level of the external power supply voltage; and
    a delay unit for delaying the output signal of the output driver according to the detection result.

4. The delay locked loop of claim 2, wherein the delay block comprises:
    a plurality of delay units; and
    a plurality of clock supply units for supplying the internal clock to the individual delay units in response to the control signals and the selection signals.

5. The delay locked loop of claim 1, wherein the delay block comprises:
    a plurality of delay units; and
    a plurality of clock supply units for supplying the internal clock to the individual delay units in response to the control signals and the selection signals.

6. The delay locked loop of claim 5, wherein the selection signals are inputted to the clock supply units.

* * * * *

UNITED STATES PATENT AND TRADEMARK OFFICE
CERTIFICATE OF CORRECTION

| | | |
|---|---|---|
| PATENT NO. | : 7,902,889 B2 | Page 1 of 1 |
| APPLICATION NO. | : 11/819811 | |
| DATED | : March 8, 2011 | |
| INVENTOR(S) | : Lee et al. | |

It is certified that error appears in the above-identified patent and that said Letters Patent is hereby corrected as shown below:

Title Page;
Change FOREIGN PATENT DOCUMENTS portion of section (56) for References Cited as follows:

FOREIGN PATENT DOCUMENTS

| | | |
|---|---|---|
| JP | 2005-251370 | 9/2005 |
| KR | 10-2001-0064123 | 7/2001 |
| KR | 1020030003340 | 1/2003 |
| KR | 10-2003-0018627 | 3/2003 |
| KR | 1020040093819 | 11/2004 |
| KR | 10-2005-0067544 | 7/2005 |
| KR | 10-2006-0036662 | 5/2006 |

Signed and Sealed this
Twelfth Day of April, 2011

David J. Kappos
*Director of the United States Patent and Trademark Office*